(12) United States Patent
Miyoshi et al.

(10) Patent No.: US 9,293,417 B2
(45) Date of Patent: Mar. 22, 2016

(54) METHOD FOR FORMING BARRIER FILM ON WIRING LINE

(75) Inventors: Hidenori Miyoshi, Nirasaki (JP); Masamichi Hara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 195 days.

(21) Appl. No.: 13/349,991

(22) Filed: Jan. 13, 2012

(65) Prior Publication Data

US 2012/0114869 A1    May 10, 2012

Related U.S. Application Data

(63) Continuation of application No. PCT/JP2010/061595, filed on Jul. 8, 2010.

(30) Foreign Application Priority Data

Jul. 14, 2009  (JP) ................................ 2009-165602

(51) Int. Cl.
*B05D 5/12* (2006.01)
*H01L 23/532* (2006.01)
(Continued)

(52) U.S. Cl.
CPC .......... *H01L 23/53238* (2013.01); *C23C 16/02* (2013.01); *C23C 16/0236* (2013.01); *C23C 16/04* (2013.01); *C23C 16/042* (2013.01);
(Continued)

(58) Field of Classification Search
CPC ................... H01L 2924/00; H01L 2924/0002; H01L 21/28556; H01L 21/76843; H01L 21/76849; H01L 21/7685; H01L 21/76868; H01L 21/76871; H01L 21/76876; H01L 23/53238; C23C 16/02; C23C 16/0218; C23C 16/0236; C23C 16/027; C23C 16/04; C23C 16/042; C23C 16/16; C23C 16/18; C23C 16/405
USPC ................. 427/489, 563, 564, 576–579, 583, 427/96.1–99.4, 250–253, 255.15, 255.18, 427/255.29, 255.37, 255.393
See application file for complete search history.

(56) References Cited

U.S. PATENT DOCUMENTS 6,136,680 A * 10/2000 Lai et al. ...................... 438/597
6,656,840 B2 * 12/2003 Rajagopalan et al. ........ 438/687
(Continued)

FOREIGN PATENT DOCUMENTS

CN      1961418 A      5/2007
CN    101466864 A      6/2009
(Continued)

OTHER PUBLICATIONS

Au et al.; "Selective Chemical Vapor Deposition of Manganese Self-Aligned Capping Layer for Cu Interconnections in Microelectronics"; Journal of the Electrochemical Society, vol. 157 (6), D3 41-D3 45; Apr. 26, 2010.*

(Continued)

*Primary Examiner* — Marianne L Padgett
(74) *Attorney, Agent, or Firm* — Rothwell, Figg, Ernst & Manbeck, P.C.

(57) ABSTRACT

Disclosed is a film-forming method wherein a manganese-containing film is formed on a substrate having a surface to which an insulating film and a copper wiring line are exposed. The film-forming method includes forming a manganese-containing film on the copper wiring line by a CVD method which uses a manganese compound.

17 Claims, 15 Drawing Sheets

(51) Int. Cl.

| | |
|---|---|
| *C23C 16/16* | (2006.01) |
| *C23C 16/18* | (2006.01) |
| *C23C 16/02* | (2006.01) |
| *C23C 16/04* | (2006.01) |
| *C23C 16/40* | (2006.01) |
| *H01L 21/285* | (2006.01) |
| *H01L 21/768* | (2006.01) |

(52) U.S. Cl.
CPC ............... *C23C16/16* (2013.01); *C23C 16/18* (2013.01); *C23C 16/405* (2013.01); *H01L 21/28556* (2013.01); *H01L 21/76849* (2013.01); *H01L 2924/0002* (2013.01)

(56) References Cited

U.S. PATENT DOCUMENTS

| | | | |
|---|---|---|---|
| 6,858,539 B2 | 2/2005 | Minamihaba et al. | |
| 6,969,539 B2* | 11/2005 | Gordon et al. | 427/255.29 |
| 7,332,426 B2* | 2/2008 | Ikeda et al. | 438/618 |
| 7,648,899 B1* | 1/2010 | Banerji et al. | 438/598 |
| 7,932,176 B2* | 4/2011 | Gordon et al. | 438/627 |
| 8,008,184 B2 | 8/2011 | Matsumoto et al. | |
| 8,039,966 B2* | 10/2011 | Yang et al. | 257/773 |
| 8,444,868 B2* | 5/2013 | Cheng et al. | 216/58 |
| 8,569,165 B2* | 10/2013 | Gordon et al. | 438/628 |
| 8,709,541 B2* | 4/2014 | Matsumoto et al. | 427/255.6 |
| 8,765,221 B2* | 7/2014 | Miyoshi et al. | 427/255.31 |
| 8,865,590 B2* | 10/2014 | Matsumoto et al. | 438/638 |
| 8,956,971 B2* | 2/2015 | Haukka et al. | 438/655 |
| 9,048,294 B2* | 6/2015 | Tang et al. | |
| 9,111,938 B2* | 8/2015 | Baumann | H01L 23/53238 |
| 9,112,003 B2* | 8/2015 | Haukka | H01L 21/02068 |
| 9,112,005 B2* | 8/2015 | Gordon | C23C 16/18 |
| 9,136,132 B2* | 9/2015 | Matsumoto | H01L 21/67207 |
| 2002/0098685 A1* | 7/2002 | Sophie et al. | 438/633 |
| 2002/0130164 A1* | 9/2002 | Matsuki et al. | 228/206 |
| 2002/0132563 A1* | 9/2002 | Luo et al. | 451/41 |
| 2003/0094593 A1* | 5/2003 | Hellring et al. | 252/79.1 |
| 2003/0136423 A1* | 7/2003 | Akbar et al. | 134/3 |
| 2004/0014319 A1* | 1/2004 | Sahota et al. | 438/692 |
| 2004/0161924 A1* | 8/2004 | Chen et al. | 438/637 |
| 2004/0241321 A1* | 12/2004 | Ganguli et al. | 427/255.28 |
| 2005/0233555 A1 | 10/2005 | Rajagopalan et al. | |
| 2005/0272247 A1* | 12/2005 | Ikeda et al. | 438/618 |
| 2006/0019493 A1* | 1/2006 | Li | 438/680 |
| 2006/0046479 A1* | 3/2006 | Rajagopalan et al. | 438/683 |
| 2006/0189133 A1* | 8/2006 | Dimitrakopoulos et al. | 438/687 |
| 2007/0045851 A1* | 3/2007 | Kitada et al. | 257/758 |
| 2007/0048991 A1* | 3/2007 | Shih et al. | 438/597 |
| 2007/0197023 A1* | 8/2007 | Widodo et al. | 438/627 |
| 2007/0289604 A1* | 12/2007 | Fukunaga et al. | 134/3 |
| 2007/0292615 A1* | 12/2007 | Dordi et al. | 427/299 |
| 2008/0054466 A1* | 3/2008 | Nasu et al. | 257/751 |
| 2008/0054467 A1* | 3/2008 | Ohba et al. | 257/751 |
| 2008/0146015 A1* | 6/2008 | Usui et al. | 438/608 |
| 2008/0213998 A1* | 9/2008 | Nagai et al. | 438/653 |
| 2008/0315429 A1* | 12/2008 | McFeely et al. | 257/773 |
| 2009/0020883 A1* | 1/2009 | Nomura et al. | 257/774 |
| 2009/0042397 A1* | 2/2009 | Miyoshi | 438/706 |
| 2009/0130849 A1* | 5/2009 | Lee | 438/693 |
| 2009/0197405 A1 | 8/2009 | Besling et al. | |
| 2009/0243112 A1* | 10/2009 | Koike et al. | 257/762 |
| 2009/0263965 A1* | 10/2009 | Gordon et al. | 438/643 |
| 2009/0321937 A1* | 12/2009 | Haneda et al. | 257/751 |
| 2009/0324827 A1* | 12/2009 | Miyoshi | 427/255.28 |
| 2009/0325393 A1* | 12/2009 | Miyoshi et al. | 438/795 |
| 2010/0167535 A1* | 7/2010 | Nishiwaki et al. | 438/669 |
| 2011/0049716 A1* | 3/2011 | Yang et al. | 257/751 |
| 2013/0136859 A1* | 5/2013 | Matsumoto et al. | 427/243 |
| 2015/0118100 A1* | 4/2015 | Anthis et al. | 420/434 |
| 2015/0270166 A1* | 9/2015 | Matsumoto | H01L 21/76856 438/635 |

FOREIGN PATENT DOCUMENTS

| | | |
|---|---|---|
| JP | 2003-243392 | 8/2003 |
| JP | 2004-146582 | 5/2004 |
| JP | 2008-13848 A | 1/2008 |
| JP | 2008-300567 | 12/2008 |
| JP | 2008-300567 A | 12/2008 |
| JP | 2009-518844 | 5/2009 |
| KR | 10-2006-0101758 A | 9/2006 |
| KR | 10-2008-0080612 A | 9/2008 |
| WO | 2007/066277 A2 | 6/2007 |

OTHER PUBLICATIONS

International Search Report issued Sep. 14, 2010 in PCT/JP2010/061595 filed Jul. 8, 2010.

Koji Neishi, et al.; "Formation of a manganese oxide barrier layer with thermal chemical vapor deposition for advanced large-scale integrated interconnect structure"; Applied Physics Letters, 2008, vol. 93, pp. 032106-0~032106-3, published online Jul. 23, 2008.

* cited by examiner (REFERENCE EXAMPLE)

METHOD FOR FORMING BARRIER FILM ON WIRING LINE

This application is a Continuation Application of PCT International Application No. PCT/JP2010/061595 filed on Jul. 8, 2010, which designated the United States.

FIELD OF THE INVENTION

The present invention relates to a film forming method for forming a film.

BACKGROUND OF THE INVENTION

In Japanese Patent Application Publication No. 2003-243392, a conductive cobalt-tungsten-phosphorous (CoWP) film which is selectively grown by an electroless plating method using as a catalyst a copper wiring line copper wiring line is used as a cap film of the copper wiring line copper wiring line.

However, the CoWP film formed by an electroless plating method using as a catalyst the copper wiring line is isotropically grown on the wiring line. Therefore, as the thickness of the CoWP film is increased, the CoWP is formed on an interlayer insulating film as well as on the copper wiring line. When copper is not completely removed and a residue of copper remains on the interlayer insulating film, the CoWP film is also formed on the residue.

In other words, the CoWP film has an insufficient selective growth property.

SUMMARY OF THE INVENTION

In view of the above, the present invention provides a film forming method capable of determining whether or not a film serving as a cap film or a barrier film is formed.

In accordance with an aspect of the present invention, there is provided a film-forming method for forming a manganese-containing film on a substrate having a surface to which an insulating film and a copper wiring line are exposed. The film-forming method includes (1) forming a manganese-containing film on the copper wiring line by a CVD method using a manganese compound

DETAILED DESCRIPTION OF THE EMBODIMENTS

Figure 1:
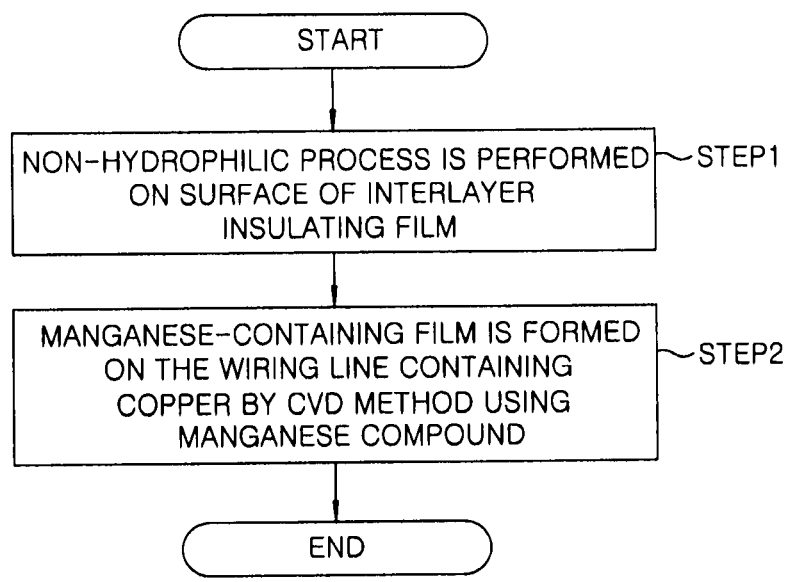
FIG. 1 is a flowchart showing an example of a film forming method in accordance with a first embodiment of the present invention.

Hereinafter, embodiments of the present invention will be described with reference to the accompanying drawings which form a part hereof. Throughout the entire drawings, like reference numerals denote like parts.

(First Embodiment)
(Example of Film Forming Method)

FIG. 1 is a flowchart showing an example of a film forming method in accordance with a first embodiment of the present invention. FIGS. 2A to 2D are cross sectional views showing examples of states of a substrate.

Figure 2A:
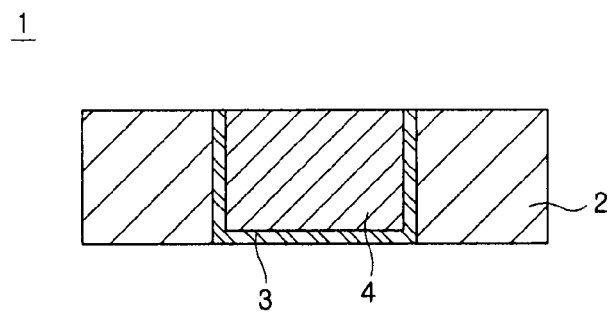
FIGS. 2A to 2D are cross sectional views showing examples of states of a substrate.

FIG. 2A shows an example of a substrate 1. In this example, the substrate 1 is a semiconductor wafer, e.g., a silicon wafer. In FIGS. 2A to 2D, illustration of devices such as a silicon wafer, a transistor and the like is omitted, and only a wiring line and an interlayer insulating film formed on a silicon wafer are schematically illustrated.

As shown in FIG. 2A, an interlayer insulating film 2 is formed on a silicon wafer (not shown). The interlayer insulating film 2 is, e.g., a silicon oxide-based insulating film. A groove for forming a wiring line is formed on the interlayer insulating film 2, and a copper wiring line 4 is formed inside the groove. Moreover, a barrier film 3 is formed around the wiring line 4.

In the first embodiment, a manganese-containing film is formed on the substrate 1 having a surface to which the copper wiring line 4 and the insulating film, e.g., the interlayer insulating film 2 in this embodiment, are exposed.

In the first embodiment, the manganese-containing film is formed in the following manner.

Figure 2B:
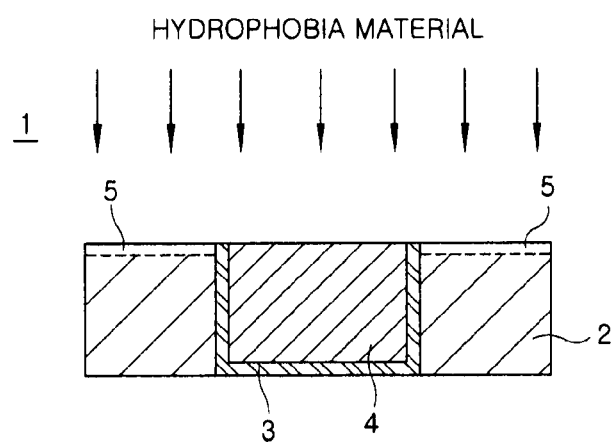

First, as described in step 1 of FIG. 1, the substrate 1 shown in FIG. 2A is loaded into a processing chamber of a processing apparatus (not shown) and, then, a non-hydrophilic process is performed on the surface of the interlayer insulating film 2, the non-hydrophilic process making the surface of the interlayer film 2 non-hydrophilic. In this embodiment, for example, a hydrophobic process is performed on the surface of the interlayer insulating film 2 by using a hydrophobic material having a hydrophobic effect which allows the surface of the interlayer insulating film 2 to have a hydrophobic property. As a result of this process, a non-hydrophilic region 5 is formed on the surface of the interlayer insulating film 2 (FIG. 2B). In this embodiment, hexa-methyl-di-silazane (HMDS) is used as the hydrophobic material. For example, when the surface of the interlayer insulating film 2 is terminated by "—OH group" due to steam in air and has a hydrophilic property, a hydrophilic "—OH group" is substituted by a hydrophobic "—O—Si(CH$_3$)$_3$ group" by HMDS. As a result, in this embodiment, the non-hydrophilic region 5 is changed to a hydrophobic region. An example of the specific processing conditions is as follows.

Pressure in processing chamber: about 1 Pa to about 101.3 kPa (atmospheric pressure)

Substrate temperature: a room temperature to about 300° C.

Atmosphere in processing chamber: HMDS atmosphere

Processing time: about 1 sec to about 600 sec

Figure 2C:
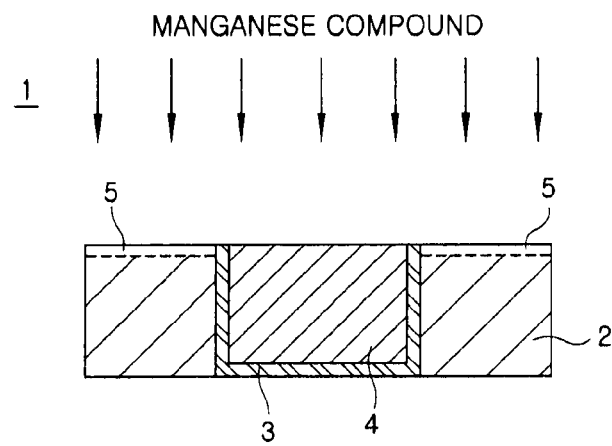
Figure 2D:
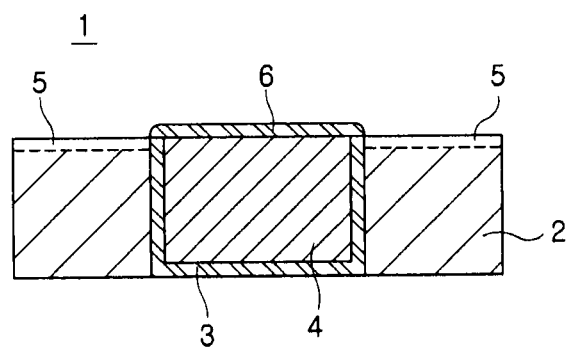

Next, in the substrate 1 shown in FIG. 2B, a manganese-containing film is formed on the copper wiring line 4 by a CVD method using a manganese compound as a film forming gas as described in step 2 of FIG. 1. In this embodiment, a thermal CVD method using as the film forming gas a manganese compound, e.g., bisethylcyclopentadienylmanganese ((EtCp)$_2$Mn[=Mn(C$_2$H$_5$C$_5$H$_4$)$_2$]), is used (FIG. 2C). As a result of this process, in this embodiment, a manganese-containing film 6 is formed only on the copper wiring line 4. The manganese-containing film 6 is, e.g., a film containing a manganese oxide. The manganese oxide is produced by reaction with moisture in the base (in this specification, it is assumed that moisture contains H$_2$O and hydroxy (OH)). Therefore, the manganese-containing film 6 is hardly formed on the interlayer insulating film 2 having thereon the non-hydrophilic region 5 and is selectively formed on only the copper wiring line 4 (FIG. 2D). An example of the specific processing conditions is as follows.

Pressure in processing chamber: about 1 Pa to about 1000 Pa

Substrate temperature: about 50° C. to about 400° C.

Atmosphere in processing chamber: (EtCp)$_2$Mn atmosphere

Processing time: about 1 sec to about 600 sec

In accordance with the first embodiment, the manganese-containing film 6 is hardly formed on the interlayer insulating film 2 and is selectively formed on only the copper wiring line 4.

The manganese-containing film 6, especially a film containing a manganese oxide, has a function of suppressing diffusion of copper, and thus can serve as a barrier film for suppressing diffusion of copper.

In accordance with the first embodiment, the manganese-containing film 6 can be selectively formed on only the copper wiring line 4. Accordingly, the manganese-containing film can serve as a so-called cap film.

Moreover, in accordance with the first embodiment, the manganese-containing film 6 is hardly formed on the interlayer insulating film 2 having thereon the non-hydrophilic region 5. This is because the manganese compound, e.g., (EtCp)$_2$Mn in this embodiment, is easily adsorbed on the Si—OH surface but is hardly adsorbed on the Si—CH$_3$ surface due to directivity and π atoms of cyclopentadienyl (Cp).

Even when a manganese compound having a cyclopentadienyl-based organic ligand, other than (EtCp)$_2$Mn, is used as the manganese compound, it is possible to obtain the effect in which the manganese-containing film 6 is hardly formed on the interlayer insulating film 2 having thereon the non-hydrophilic region 5. The manganese compound may include the following compounds.

The manganese compound having a cyclopentadienyl-based organic ligand may be, for example, Cp$_2$Mn[=Mn(C$_5$H$_5$)$_2$],
(MeCp)$_2$Mn[=Mn(CH$_3$C$_5$H$_4$)$_2$],
(i-PrCp)$_2$Mn[=Mn(C$_3$H$_7$C$_5$H$_4$)$_2$],
MeCpMn(CO)$_3$[=(CH$_3$C$_5$H$_4$)Mn(CO)$_3$],
(t-BuCp)$_2$Mn[=Mn(C$_4$H$_9$C$_5$H$_4$)$_2$],
Mn(DMPD)(EtCp)[=Mn(C$_7$H$_{11}$C$_2$H$_5$C$_5$H$_4$)], or
(CH$_3$)$_5$Cp)$_2$Mn[=Mn((CH$_3$)$_5$C$_5$H$_4$)$_2$].

Further, the hydrophobic material having the hydrophobic effect which allows the surface of the interlayer insulating film 2 to have the hydrophobic property may include the following silicon-containing organic compounds, other than HMDC.

TMDS (1,1,3,3-Tetramethyldisilazane)
TMSDMA (Dimethylaminotrimethylsilane)
DMSDMA (Dimethylsilyldimethylamine)
TMMAS (Trimethylmethylaminosilane)
TMICS (Trimethyl(isocyanato)silane)
TMSA (Trimethylsilylacetylene)
TMSC (Trimethylsilylcyanide)
1,3,5,7-tetramethylcyclotetrasiloxane
dimethylsilane
tetradethylcyclotetrasiloxane
1,2,3-triethyl-2,4,6-trimethylcyclotrisilazane
1,2,3,4,5,6-hexamethylcyclotrisilizane
monomethylsilane
hexamethyldisilane
hexamethylsiloxane
trimethylsilane
tetramethylsilane
dimethyldimethoxysilane
octamethylcyclotetrasiloxane
trimethoxymethylsilane
hexaethyldisilazane
hexaphenyldisilazne
heptamethyldisilazane
dipropyl-tetramethyldisilazane
di-n-butyl-tetramethyldisilazane
di-n-octyl-tetramethyldisilazane
divinyl-tetramethyldisilazne
1,1,3,3,5,5-hexamethylcyclotrisilazane
hexaethylcyclotrisilazane
hexaphenylcyclotrisilazane
octamethylcyclotetrasilazane
octaethylcyclotetrasilazane
tetraethyl-tetramethylcyclotetrasilazane
tetraphenyldimethyldisilazane
diphenyl-tetramethyldisilazane
trivinyl-trimethylcyclotrisilazane
tetravinyl-tetramethylcyclotetrasilazane Furthermore, the manganese-containing film 6, especially the film containing manganese oxide, is formed by reaction with moisture in the base. Therefore, in order to prevent the surface of the interlayer insulating film 2 from having the hydrophilic property, a process for annealing the substrate 1 and dehydrating the interlayer insulating film 2 may be performed instead of a hydrophobic process. By dehydrating the interlayer insulating film 2, moisture is removed from the interlayer insulating film 2. Accordingly, moisture for oxidizing manganese can be almost completely removed from the interlayer insulating film 2, and the growth of the manganese-containing film 6 onto the interlayer insulating film 2 can be suppressed.

In the annealing of the substrate 1, for example, the temperature of the substrate 1 during annealing is set to be higher than the temperature of the substrate 1 during formation of the manganese-containing film 6. At this time, the temperature is preferably set to a level which is sufficient to vaporize the moisture and is able to minimize thermal budget applied to the substrate 1. Specifically, the interlayer insulating film 2 is dehydrated at the temperature in the range from about 100° C. to 300° C.

Besides, both of the hydrophobic process and the dehydration process may be performed. In that case, the interlayer insulating film 2 is dehydrated after the hydrophobic process is performed on the surface of the interlayer insulating film 2. Hence, the growth of the manganese-containing film 6 on the interlayer insulating film 2 can be further suppressed.

Alternatively, the hydrophobic process may be performed after the interlayer insulating film 2 is dehydrated.

The effect in which the manganese-containing film 6 is hardly formed on the interlayer insulating film 2 and is selectively formed on only the copper wiring line 4 is described as follows.

Figure 3:
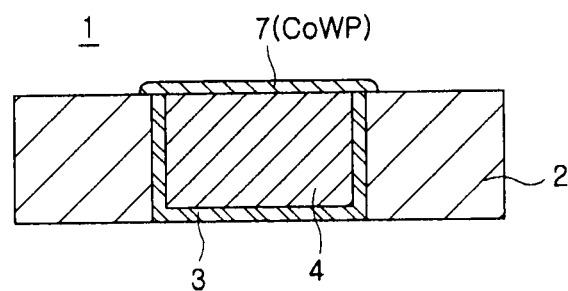
FIG. 3 is a cross sectional view showing a reference example.

FIG. 3 is a cross sectional view showing a reference example.

FIG. 3 shows an example in which a CoWP film 7 is used as a cap film. The CoWP film is formed by an electroless plating method using the copper wiring line 4 as a catalyst. Therefore, the CoWP film 7 isotropically grows on the copper wiring line 4. In case that the CoWP film 7 isotropically grows on the copper wiring line 4, the CoWP film 7 is widened in a horizontal direction as the thickness thereof is increased. As a result, the CoWP film 7 is also formed on the interlayer insulating film 2.

If the CoWP film 7 is formed on the interlayer insulating film 2, the adjacent CoWP films 7 may come into contact with each other in case where the gap between the wiring lines 4 is small. Since the CoWP film 7 is conductive, the contact between the CoWP films 7 leads to short-circuit of the wiring lines 4. Moreover, in case that copper is incompletely removed and a residue of copper remains on the interlayer insulating film 2, the CoWP film 7 grows on the residue on the interlayer insulating film 2. For example, in case that the interlayer insulating film 2 is a low dielectric insulating film (Low-k film) made of a soft material, the CoWP film 7 formed on the interlayer insulating film 2 may deteriorate the quality of the interlayer insulating film 2.

On the other hand, in the first embodiment, the formation of the manganese-containing film 6 on the interlayer insulating film 2 can be suppressed. Thus, even when the interlayer insulating film 2 is, e.g., a low dielectric insulating film (low-k film) made of a soft material, the possibility of deteriorating the quality of the interlayer insulating film 2 can be reduced compared to the case of using the CoWP film 7 as a cap film.

Further, the gap between the wiring lines 4 can be reduced to be smaller than or equal to, e.g., the gap between the CoWP films 7. Therefore, a semiconductor device in which the manganese-containing film 6 is used as a cap film is advantageous in high integration compared to a semiconductor device in which the CoWP film 7 is used as a cap film.

In accordance with the first embodiment, it is possible to provide the film forming method capable of forming a film serving as a cap film or a barrier film with a good selective growth property.

(Configuration of Apparatus)
(Film Forming System)

Figure 4:
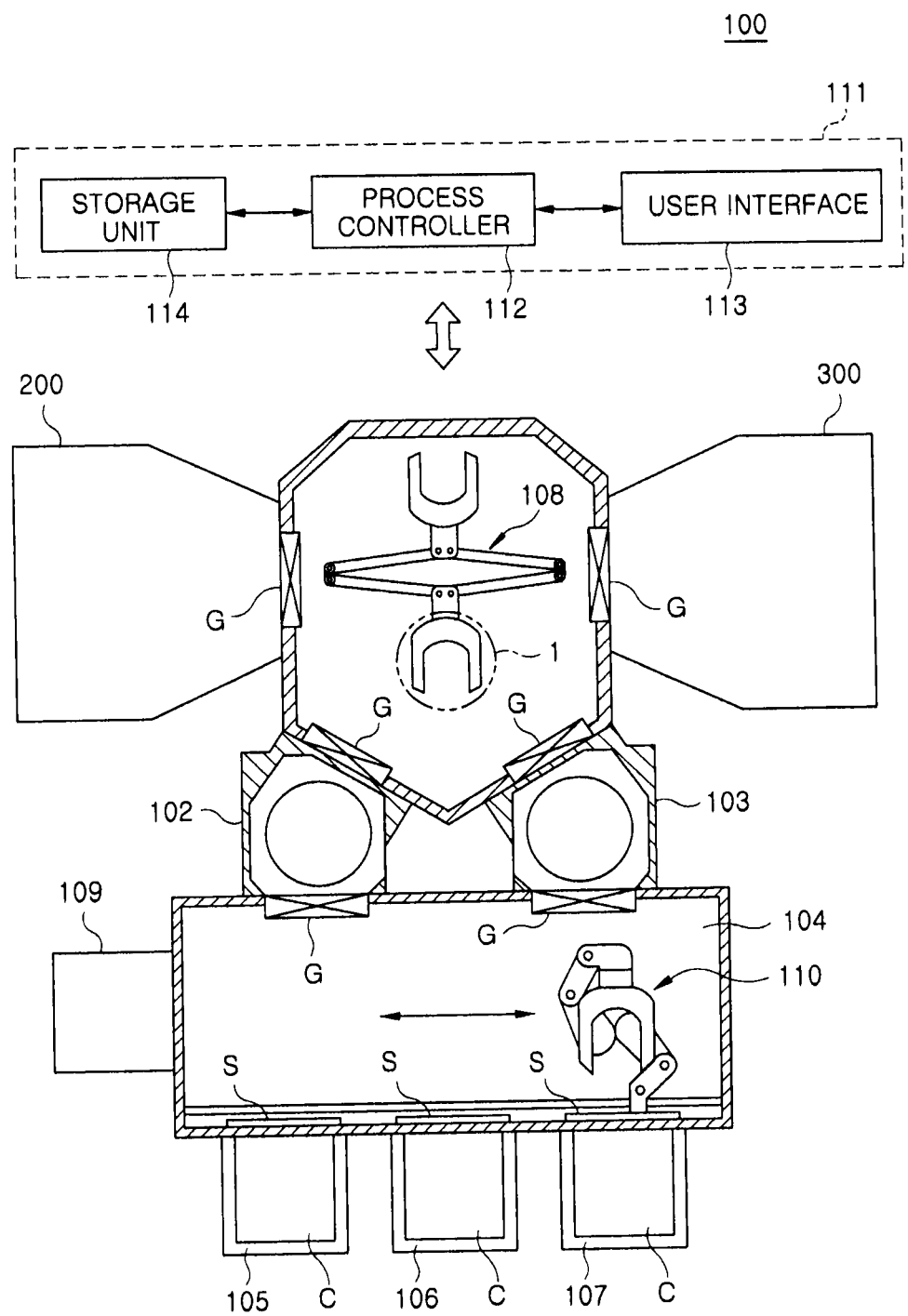
FIG. 4 is a top view schematically showing an example of a film forming system capable of performing the example of the film forming method.

FIG. 4 is a top view schematically showing an example of a film forming system capable of performing the example of the film forming method in accordance with the first embodiment of the present invention.

As shown in FIG. 4, a film forming system 100 includes a first processing unit 200 and a second processing unit 300. The processing units 200 and 300 are provided at two sides of a transfer chamber 101 having a polygonal shape. Load-lock chambers 102 and 103 are provided at other two sides of the transfer chamber 101. A loading/unloading chamber 104 is disposed at the sides of the load-lock chambers 102 and 103 opposite to the transfer chamber 101. Ports 105, 106 and 107 to which three carriers C capable of accommodating wafers W therein are attached are provided at the side of the loading/unloading chamber 104 opposite to the load-lock chambers 102 and 103.

The processing units 200 and 300, and the load-lock chambers 102 and 103 are connected to the transfer chamber 101 via gate valves G. The processing unit 200 and 300, and the load-lock chambers 102 and 103 communicate with the transfer chamber 101 by opening the gate valves G, and are isolated from the transfer chamber 101 by closing the gate valves G. The load-lock chambers 102 and 103 are connected to the loading/unloading chamber 104 via gate valves G. The load-lock chambers 102 and 103 communicate with the loading/unloading chamber 104 by opening the gate valves G, and are isolated from the loading/unloading chamber 104 by closing the corresponding gate valves G.

Provided in the transfer chamber 101 is a transfer device 108 for loading and unloading the substrate 1 into and from the processing units 200 and 300, and the load-lock chambers 102 and 103. The transfer device 108 is disposed at a substantially central portion of the transfer chamber 101. The inside of the transfer chamber 101 is maintained at a predetermined vacuum level. The substrate 1 is transferred between the processing units 200 and 300 and the load-lock chambers 102 and 103 without being exposed to the atmosphere.

Shutters S are respectively provided at the ports 105 to 107 of the loading/unloading chamber 104. When the carriers C, either accommodating substrates 1 therein or remaining empty, are attached to the ports 105 to 107, the shutters S are opened so that the carrier C are allowed to communicate with the loading/unloading chamber 104 while preventing infiltration of exterior air. Further, an alignment chamber 109 is provided at one side of the loading/unloading chamber 104. In the alignment chamber 109, the substrate 1 is aligned.

Provided in the loading/unloading chamber 104 is a transfer device 110 for loading and unloading the substrate 1 into and from the carrier C, the alignment chamber 109, and the load-lock chambers 102 and 103.

A control unit 111 controls the film forming system 100. The control unit 111 has a process controller 112, a user interface 113 and a storage unit 114. The user interface 113 includes a keyboard through which a process manager inputs commands for managing the film forming system 100; a display for visually displaying an operation state of the film forming system 100; and the like. The storage unit 114 stores therein recipes such as operating condition data or control programs to be used in realizing processes performed by the film forming system 100 under the control of the process controller 112. If necessary, the recipes are read out from the storage unit 114 under the instruction from the user interface 113 and executed by the process controller 112, thereby controlling the film forming system 100. The recipes may be stored in a computer-readable storage medium such as a hard disk, a flash memory or the like. Besides, the recipes may be transmitted from other devices via, e.g., a dedicated line, whenever necessary.

(Processing Unit 200)

The first processing unit 200 performs a non-hydrophilic process on the surface of the interlayer insulating film 2.

Figure 5:
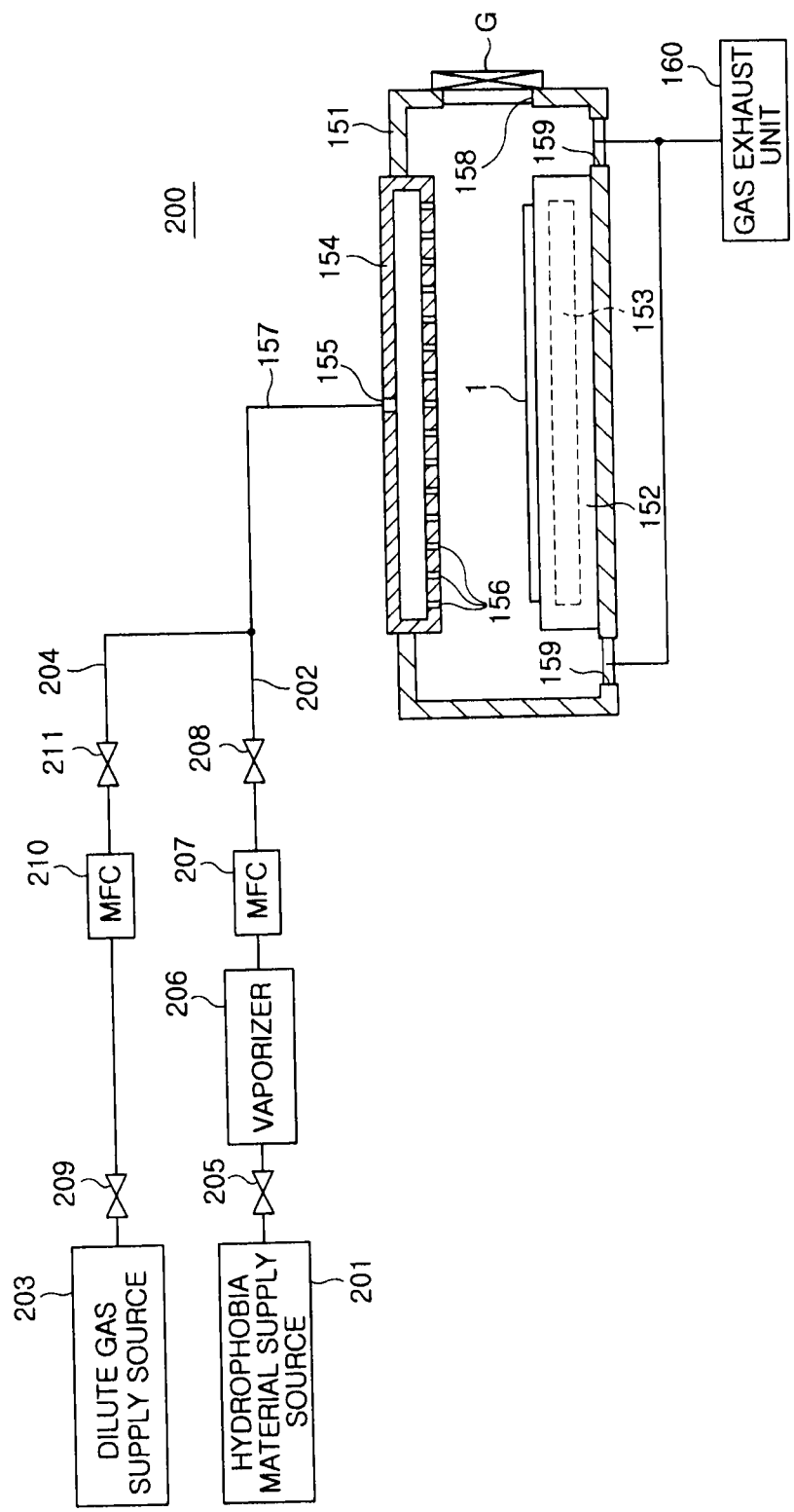
FIG. 5 is a cross sectional view schematically showing an example of a processing unit.

FIG. 5 is a cross sectional view schematically showing an example of the processing unit 200.

As shown in FIG. 5, the processing unit 200 includes a processing chamber 151 which can accommodate the substrate 1 therein and can be maintained at a vacuum state. A susceptor 152 for mounting the substrate 1 thereon is provided at a bottom portion of the processing chamber 151. A heater 153 for heating the substrate 1 is buried in the susceptor 152.

A shower head 154 is provided at an upper portion of the processing chamber 151 so as to face the susceptor 152. The shower head 154 has a gas inlet port 155 at the center of the top surface thereof and a plurality of gas injection holes 156 at the bottom surface thereof.

The gas inlet port 155 is connected to a gas supply line 157. The gas supply line 157 is connected to a line 202 extending from a hydrophobic material supply source 201 for supplying a hydrophobic material such as HMDS or the like, and a line 204 extending from a dilute gas supply source 203 for supplying a dilute gas such as Ar gas, $N_2$ gas or the like.

The line 202 is provided with a valve 205, a vaporizer 206 for vaporizing a hydrophobic material, i.e., HMDS in this embodiment, a mass flow controller (MFC) 207 and a valve 208 which are disposed in that order from the hydrophobic material supply source 201.

The line 204 is provided with a valve 209, a mass flow controller (MFC) 210 and a valve 211 which are disposed in that order from the dilute gas supply source 203.

In this embodiment, the hydrophobic material is vaporized by the vaporizer 206. The vaporized hydrophobic material is diluted by a dilute gas and then is introduced into the processing chamber 152 through the gas supply line 157 and the shower head 154. During the processing, the substrate 1 is heated to a predetermined temperature by the heater 153. In this embodiment, the temperature of the substrate 1 can be controlled between a room temperature and about 300° C., for example.

A loading/unloading port 158 for loading and unloading the substrate 1 is provided at a sidewall of the processing chamber 151. The loading/unloading port 158 can be opened and closed by a gate valve G.

A gas exhaust port 159 is provided at a bottom portion of the processing chamber 151. A gas exhaust unit 160 is connected to the gas exhaust port 159. The pressure in the processing chamber 151 can be reduced to a predetermined vacuum level by the gas exhaust unit 160.

In addition, the pressure in the processing chamber 151 can be maintained at the atmospheric pressure without connecting the gas exhaust port 159 to the gas exhaust unit 160.

(Processing Unit 300)

The second processing unit 300 forms a manganese-containing film on a copper wiring line.

Figure 6:
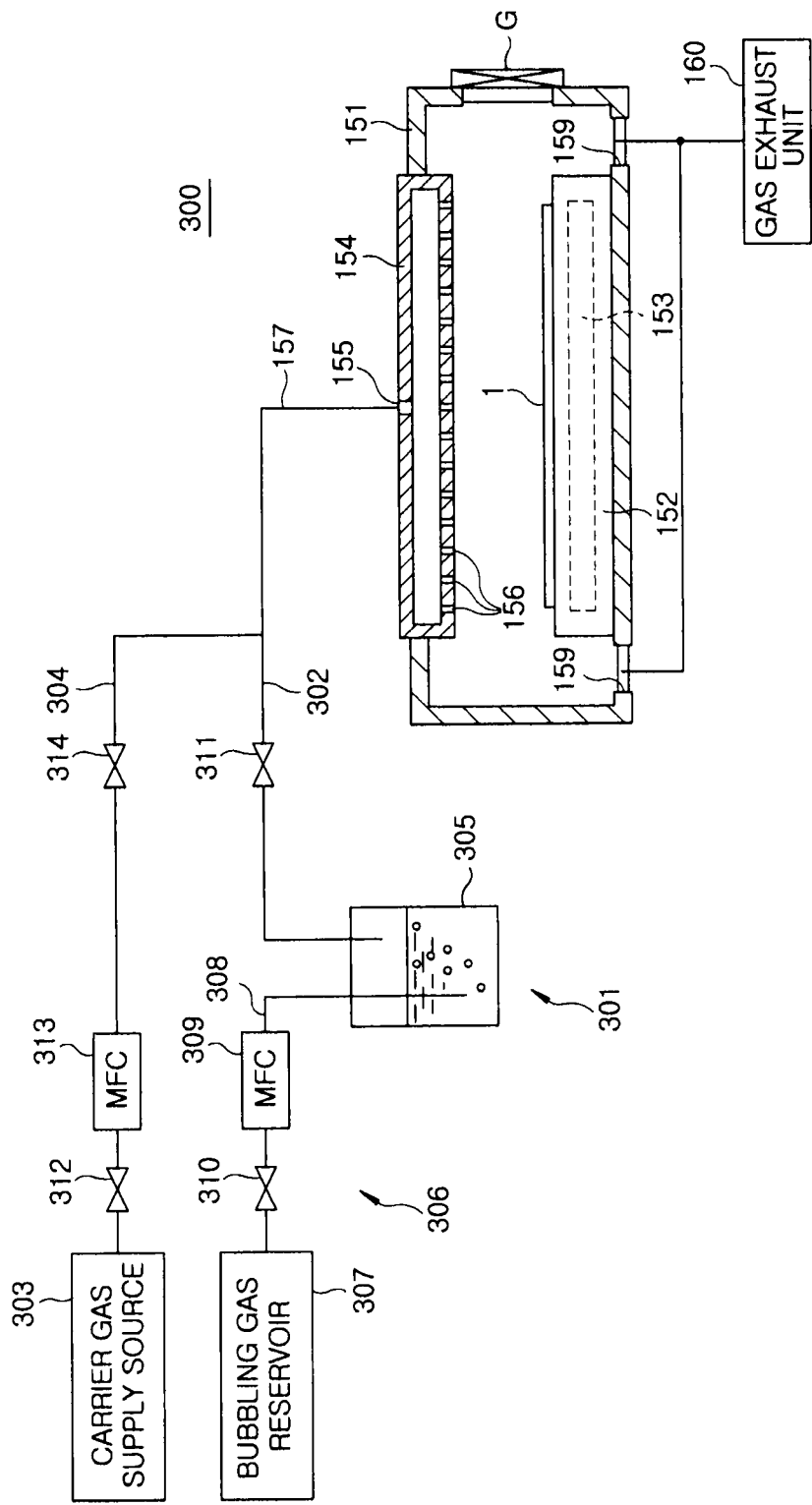
FIG. 6 is a cross sectional view schematically showing another example of a processing unit.

FIG. 6 is a cross sectional view schematically showing an example of the processing unit 300.

As shown in FIG. 6, the processing unit 300 in the present embodiment is configured as a thermal CVD apparatus for forming a manganese-containing film. As in the case of the processing unit 200, the processing unit 300 includes a processing chamber 151 and a susceptor 152. A heater 153 is buried in the susceptor 152, so that the substrate 1 can be heated to a temperature in the range from a room temperature to about 100° C., for example. Hereinafter, only the parts of the processing unit 300 which are different from the processing unit 200 will be described.

The gas supply line 157 is connected to a line 302 extending from a manganese compound supply source 301 for supplying a manganese compound such as $(EtCp)_2Mn$ or the like, and a line 304 extending from a carrier gas supply source 303 for supplying a carrier gas such as Ar gas, $N_2$ gas or the like.

In this embodiment, the manganese compound supply source 301 has a manganese compound reservoir 305. The manganese compound reservoir 305 stores therein as a manganese compound, e.g., $(EtCp)_2Mn$ in a liquid state in the present embodiment. The manganese compound reservoir 305 is connected to a bubbler 306.

In this embodiment, the bubbler 306 includes a bubbling gas reservoir 307 storing a bubbling gas therein, a supply line 308 for supplying the bubbling gas to the manganese compound reservoir 305, a mass flow controller (MFC) 309 for controlling a flow rate of the bubbling gas flowing through the supply line 308, and a valve 310. The bubbling gas may be, e.g., argon (Ar) gas, hydrogen ($H_2$) gas, nitrogen ($N_2$) gas or the like. One end of the supply line 308 is disposed in the manganese compound liquid, i.e., $(EtCp)_2Mn$ in this embodiment, stored in the manganese compound reservoir 305, i.e., $(EtCp)_2Mn$ in this example. By discharging the bubbling gas through the supply line 308, the manganese compound liquid is bubbled and vaporized. The vaporized manganese compound gas, i.e., $(EtCp)_2Mn$ gas in this embodiment, is introduced into the processing chamber 158 through the gas supply line 157 and the shower head 154 by the line 302 and the valve 311 for opening and closing the line 302.

The gas supply line 157 is connected to the line 304. The carrier gas is introduced into the processing chamber 151 from the carrier gas supply source 303 through a valve 312, a mass flow controller (MFC) 313, and a valve 314.

In an example of the film forming method in accordance with the first embodiment of the present invention, the film forming system 100 shown in FIGS. 4 to 6 is used to perform the steps of: performing a non-hydrophilic process on the surface of interlayer insulating film 2 in the processing unit 200; transferring the substrate 1 subjected to this process to the processing chamber 300 via the transfer chamber 101 without being exposed to the atmosphere; and forming a manganese-containing film on the copper wiring line in the processing unit 300.

(Another Example of Film Forming Method)

Figure 7A:
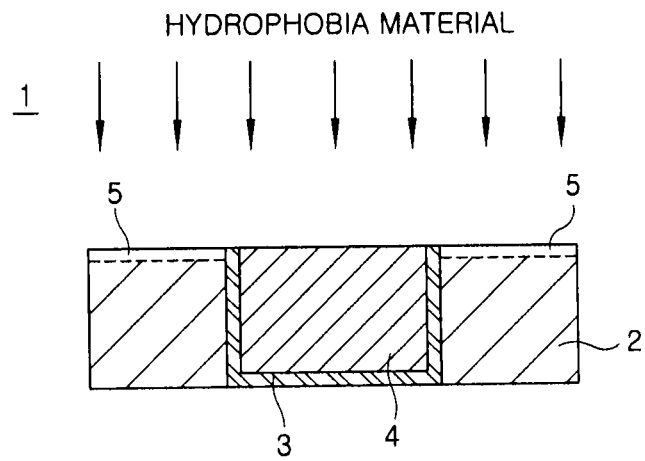
FIGS. 7A to 7C are cross sectional views showing examples of states of a substrate.
Figure 7B:
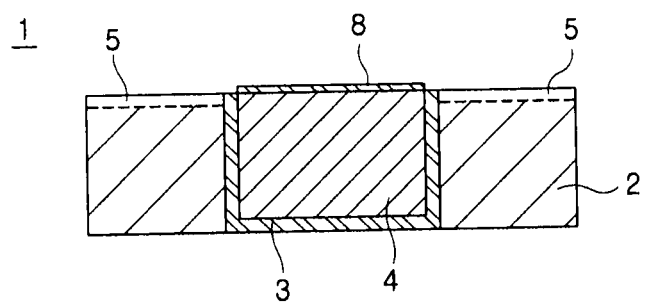
Figure 7C:
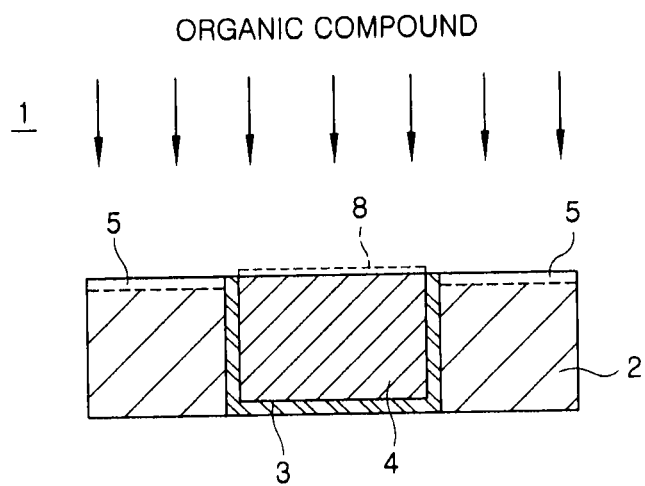

FIGS. 7A to 7C are cross sectional views showing examples of states of a substrate.

When the non-hydrophilic process is performed on the surface of the interlayer insulating film 2 as shown in FIG. 7A, a hydrophobic material and/or an oxide 8 may be adhered or formed on the surface of the copper wiring line 4 as shown in FIG. 7B. In that case, the hydrophobic material and/or the oxide 8 needs to be removed from the surface of the copper wiring line 4 while maintaining a non-hydrophilic property of the surface of the interlayer insulating film 2.

In this embodiment, the hydrophobic material and/or the oxide 8 is removed from the surface of the wiring line 4 by using an organic compound while maintaining the non-hydrophilic property of the surface of the interlayer insulating film 2 (FIG. 7C). Specifically, as for the organic compound, an organic acid containing carboxylic acid, e.g., formic acid (HCOOH), is used. An example of the specific processing conditions is as follows.

Pressure in processing chamber: about 1 Pa to about 101.3 kPa (atmospheric pressure)

Substrate temperature: about 100° C. to about 300° C.

Atmosphere in processing chamber: HCOOH atmosphere

Processing time: about 1 sec to about 600 sec

As described above, the hydrophobic material and/or the oxide 8 adhered or formed on the surface of the copper wiring line 4 can be removed by using an organic compound. By using an organic compound, it is possible to remove the hydrophobic material and/or the oxide 8 from the surface of the copper wiring line 4 while maintaining the non-hydrophilic property of the surface of the interlayer insulating film 2. After the hydrophobic material and/or the oxide 8 are removed from the surface of the copper wiring line 4, the manganese-containing film 6 may be formed on the surface of the copper wiring line 4 as described above.

As such, by removing the hydrophobic material and/or the oxide 8 from the surface of the copper wiring line 4, it is possible to suppress an increase in a contact resistance between the wiring line 4 and another wiring line connected thereto.

The organic compound that can be used in another example of the film forming method may include the following compounds.

The organic compound may be at least one selected among:
alcohol having a hydroxy group (—OH);
aldehyde having an aldehyde group (—CHO);
carboxylic acid having a carboxylic group (—COOH);
anhydrous carboxylic acid;
ester; and
ketone.

The alcohol may include:
1) monohydric alcohol, especially monohydric alcohol represented by the following formula (1)

$$R^1—OH \qquad (1)$$

($R^1$ indicates a C1 to C20 linear or branched alkyl group or alkenyl group, preferably methyl, ethyl, propyl, butyl, pentyl or hexyl),
e.g., methanol ($CH_3OH$),
ethanol ($CH_3CH_2OH$),
propanol ($CH_3CH_2CH_2OH$),
butanol ($CH_3CH_2CH_2CH_2OH$),
2-methylpropanol (($CH_3$)$_2CHCH_2OH$), and
2-methylbutanol ($CH_3CH_2CH(CH_3)CH_2OH$);

2) diatomic alcohol, especially diatomic alcohol represented by the following formula (2)

$$R^2—\underset{\underset{\displaystyle OH}{|}}{CH}—R^3 \qquad (2)$$

($R^2$ and $R^3$ indicate a C1 to C20 linear or branched alkyl group or alkenyl group, preferably methyl, ethyl, propyl, butyl, pentyl or hexyl),
e.g., 2-propanol (($CH_3$)$_2CHOH$)
2-butanol ($CH_3CH(OH)CH_2CH_3$);

3) polyhydroxyalcohol such as diol and triol,
e.g., ethyleneglycol ($HOCH_2CH_2OH$)
glycerol ($HOCH_2CH(OH)CH_2OH$);

4) cyclic alcohol having 1 to 10, typically 5 or 6, carbon atoms, in a part of the chain; and 5) aromatic alcohol such as benzylic alcohol ($C_6H_5CH_2OH$), o-, p- or m-cresol, resorcinol or the like.

The aldehyde may include:
1) aldehyde represented by the following formula (3)

$$R^4—CHO \qquad (3)$$

($R^4$ indicates hydrogen or a C1 to C20 linear or branched alkyl group or alkenyl group, preferably methyl, ethyl, propyl, butyl, pentyl or hexyl),
e.g., formaldehyde (HCHO)
acetaldehyde ($CH_3CHO$)
propionaldehyde ($CH_3CH_2CHO$), and
butylaldehyde ($CH_3CH_2CH_2CHO$);

2) alkanediol compound represented by the following formula (4)

$$OHC—R^5—CHO \qquad (4)$$

($R^5$ indicates a C1 to C20 linear or branched saturated or unsaturated hydrocarbon, or $R^5$ being omittable, i.e., direct bond between aldehyde groups).

The carboxylic acid may include:
1) carboxylic acid represented by the following formula (5)

$$R^6—COOH \qquad (5)$$

($R^6$ indicates hydrogen or a C1 to C20 linear or branched alkyl group or alkenyl group, preferably methyl, ethyl, propyl, butyl, pentyl or hexyl),
e.g., formic acid (HCOOH),
acetic acid ($CH_3COOH$),
propionic acid ($CH_3CH_2COOH$),
butyric acid ($CH_3(CH_2)_2COOH$), and
valeric acid ($CH_3(CH_2)_3COOH$.

The anhydrous carboxylic acid can be represented by the following formula (6)

$$R^7—CO—O—CO—R^8 \qquad (6)$$

($R^7$ and $R^8$ indicate a functional group in which at least a part of a hydrogen atom, a hydrocarbon group, or a hydrogen atom forming a hydrocarbon group is substituted by a halogen atom).

A specific example of the hydrocarbon group may include:
an alkyl group;
an alkenyl group;
an ankynyl group; and
an aryl group.

Specific examples of the halogen atom may include:
fluorine;
chlorine;
bromine; and
iodine.

A specific example of the anhydrous carboxylic acid may include, other than anhydrous acetic acid:
anhydrous formic acid;
anhydrous propionic acid;
anhydrous acetic formic acid;
anhydrous butyric acid; and
anhydrous valeric acid.

The ester can be represented by the following formula (7)

$$R^9—COO—R^{10} \qquad (7)$$

($R^9$ indicates a functional group in which at least a part of a hydrogen atom, a hydrocarbon group or a hydrogen atom forming a hydrocarbon group is substituted by a halogen atom, $R^{10}$ indicates a functional group in which at least a part of a hydrocarbon group or a hydrogen atom forming a hydrocarbon group is substituted by a halogen atom).

Specific examples of the hydrocarbon group and the halogen atom are the same as those described above.

Specific examples of the ester may include:
formic acid methyl;
formic acid ethyl;
formic acid propyl;
formic acid butyl;
formic acid benzyl;
acetic acid methyl;
acetic acid ethyl;
acetic acid propyl;
acetic acid butyl;
acetic acid pentyl;
acetic acid hexyl;
acetic acid octyl;
acetic acid phenyl;
acetic acid benzyl;
acetic acid aryl;
acetic acid prophenyl;
propionic acid methyl;
propionic acid ethyl;

propionic acid butyl;
propionic acid pentyl;
propionic acid benzyl;
butyric acid methyl;
butyric acid ethyl;
butyric acid pentyl;
butyric acid butyl;
valeric acid methyl; and
valeric acid ethyl.

(Configuration of Apparatus)
(Film Forming System)

Figure 8:
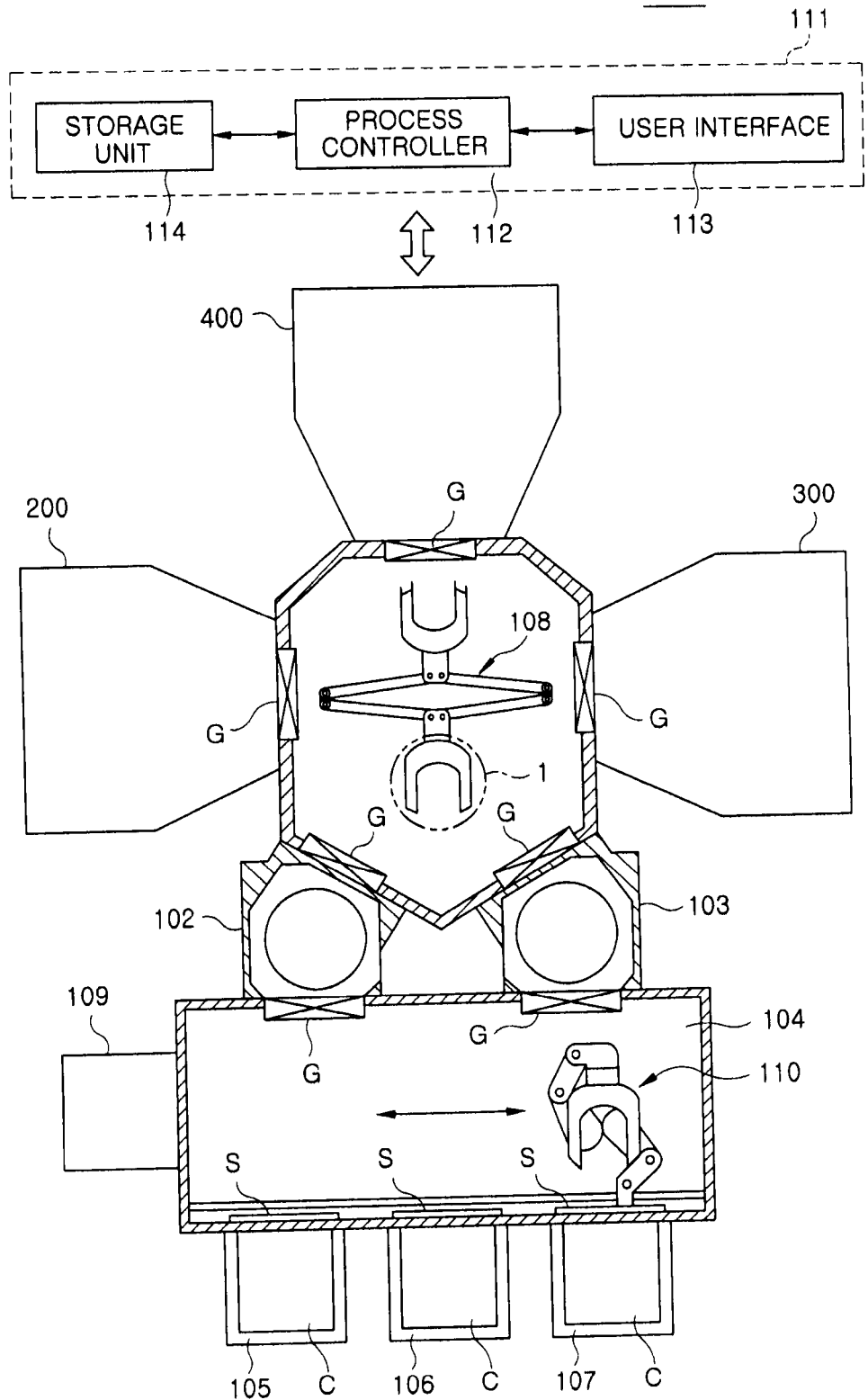
FIG. 8 is a top view schematically showing an example of a film forming system capable of performing another example of the film forming method in accordance with the first embodiment of the present invention.

FIG. 8 is a top view schematically showing an example of a film forming system capable of performing another example of the film forming method in accordance with the first embodiment of the present invention.

As shown in FIG. 8, a film forming system 100a is different from the film forming system in that a third processing unit 400 is further provided. The third processing unit 400 is connected to the transfer chamber 101 via a gate valve G.

(Processing Unit 400)

The third processing unit 400 removes the hydrophobic material and/or the oxide 8 on the surface of the wiring line 3 containing copper while maintaining the non-hydrophilic property of the surface of the interlayer insulating film 2.

Figure 9:
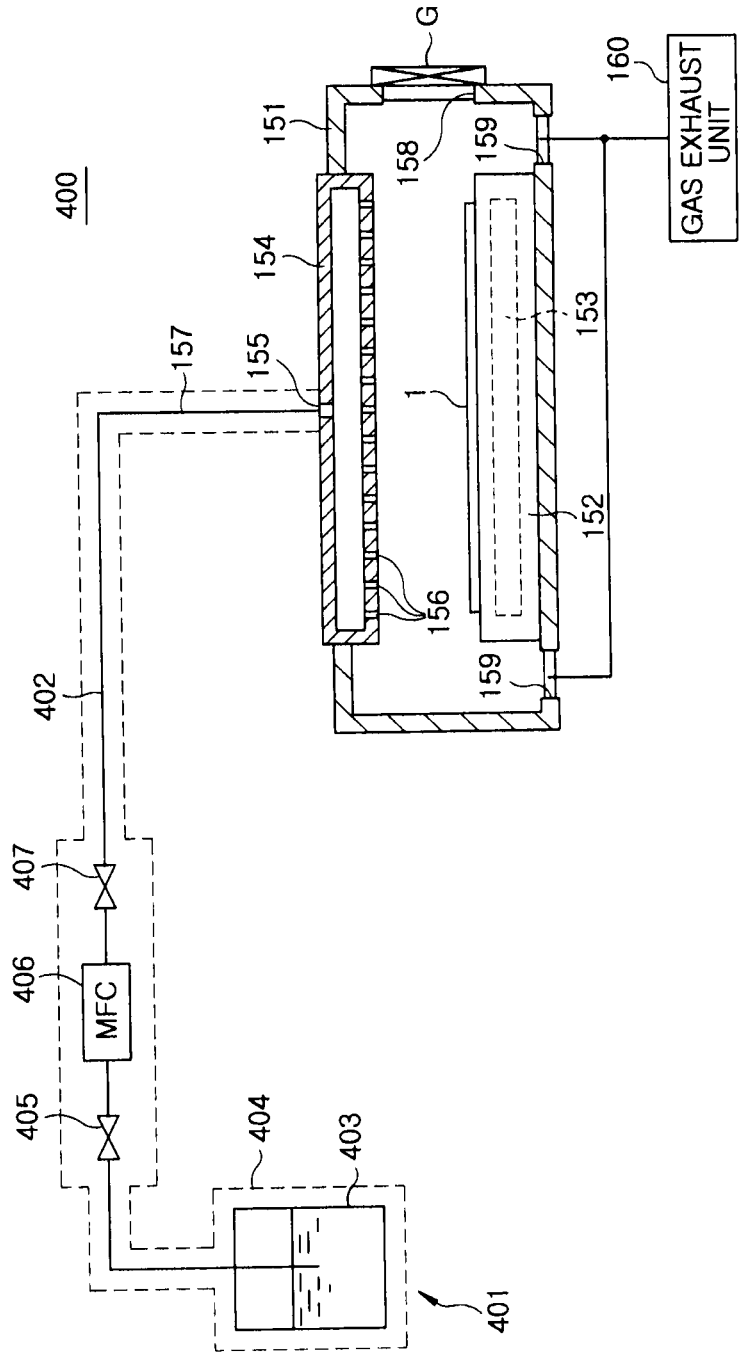
FIG. 9 is a cross sectional view schematically showing still another example of a processing unit.

FIG. 9 is a cross sectional view schematically showing an example of the processing unit 400.

As shown in FIG. 9, the processing unit 400 has substantially the same configuration as those of the processing units 200 and 300. Hereinafter, only the differences will be explained.

The gas supply line 157 is provided with a line 402 extending from an organic compound supply source 401 for supplying an organic compound.

In this example, the organic compound supply source 401 includes an organic compound reservoir 403. In this example, the organic compound reservoir 403 stores therein an organic compound, e.g., a formic acid (HCOOH) in a liquid state. The HCOOH is vaporized while being heated by a heater 404. The vaporized HCOOH gas is introduced into the processing chamber 151 through the gas supply line 157 and the shower head 154 by the line 402, a valve 405 for opening and closing the line 402, a mass flow controller (MFC) 406, and a valve 407 for opening and closing the line 402.

In this example, the heater 404 is configured to heat the gas supply line 157, the line 402, the valves 405 and 407 and the mass flow controller 406, in addition to the organic compound reservoir 403.

Although it is omitted in this example, the organic compound supply source 401 may be provided with a dilute gas supply mechanism for supplying a dilute gas for diluting an organic compound gas. The dilute gas is nitrogen ($N_2$) gas, for example.

In another example of the film forming method in accordance with the first embodiment of the present invention, the film forming system 100a shown in FIGS. 8 and 9 is used to perform the steps of: performing a non-hydrophilic process on the surface of the interlayer insulating film 2 in the processing unit 200; transferring the substrate 1 subjected to the non-hydrophilic process to the processing unit 400 via the transfer chamber 101 without being exposed to the atmosphere; removing the hydrophobic material and/or the oxide 8 from the surface of the copper wiring line 4 while maintaining the non-hydrophilic property of the surface of the interlayer insulating film 2; transferring the substrate 1 subjected to this process to the processing unit 300 via the transfer chamber 101 without being exposed to the atmosphere; and forming a manganese-containing film on the copper wiring line 4 in the processing unit 300.

(Second Embodiment)
(Example of Film Forming Method)

Figure 10:
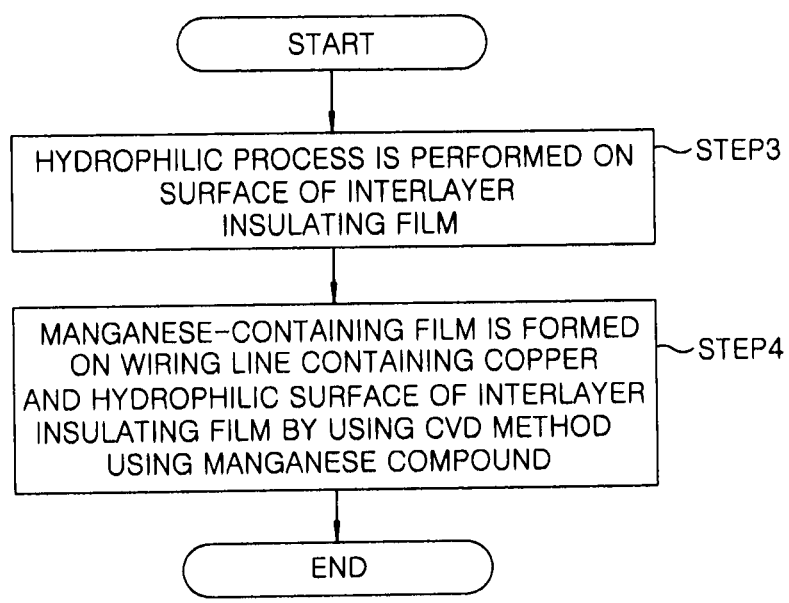
FIG. 10 is a flowchart showing an example of a film forming method in accordance with a second embodiment of the present invention.

FIG. 10 is a flow chart showing an example of the film forming method in accordance with the second embodiment of the present invention. FIGS. 11A to 11D are cross sectional views showing examples of states of a substrate.

Figure 11A:
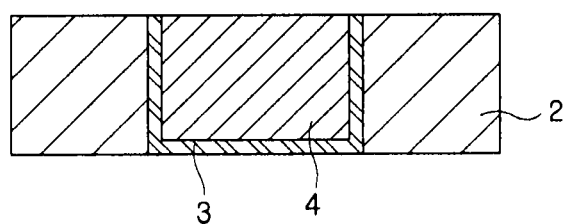
FIGS. 11A to 11D are cross sectional views showing examples of states of a substrate.

FIG. 11A shows an example of the substrate 1. In this embodiment, the substrate 1 has the same configuration as that of the substrate 1 shown in FIG. 2A.

In the second embodiment, a manganese-containing film is formed on both of the copper wiring line 4 and the interlayer insulating film 2 in the following manner.

Figure 11B:
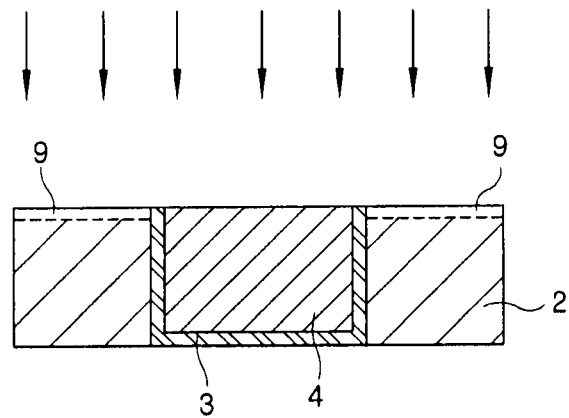

First, as described in step 3 of FIG. 3, the substrate 1 shown in FIG. 11A is loaded into a processing chamber of a processing apparatus (not shown) and, then, a hydrophilic process is performed on the surface of the interlayer insulating film 2. In this embodiment, the surface of the interlayer insulating film 2 is subjected to a plasma process, and a damage layer 9 is formed on the surface of the interlayer insulating film 2 (FIG. 11B). By forming the damage layer 9 on the surface of the interlayer insulating film 2, a hydrophobic material is removed, and the surface of the interlayer insulating film 2 becomes hydrophilic. An example of the plasma process is a process of exposing the substrate 1 to a plasma containing hydrogen (H). An example of the specific processing conditions is as follows.

Pressure in processing chamber: about 1 Pa to about 1000 Pa

Substrate temperature: a room temperature to about 300° C.

Atmosphere in processing chamber: $H_2$ atmosphere

Processing time: about 1 sec to about 600 sec

Figure 11C:
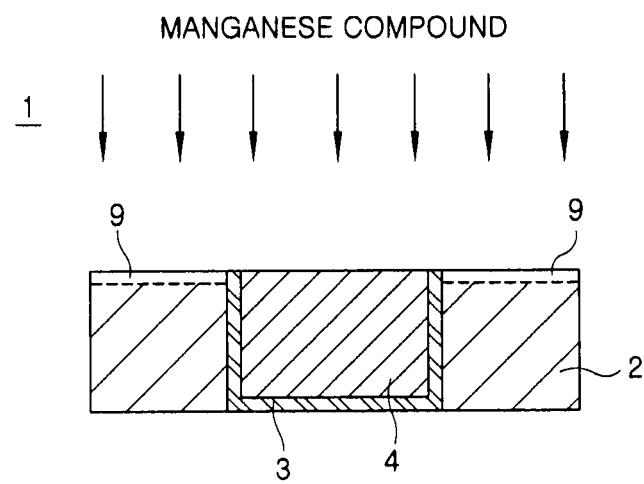
Figure 11D:
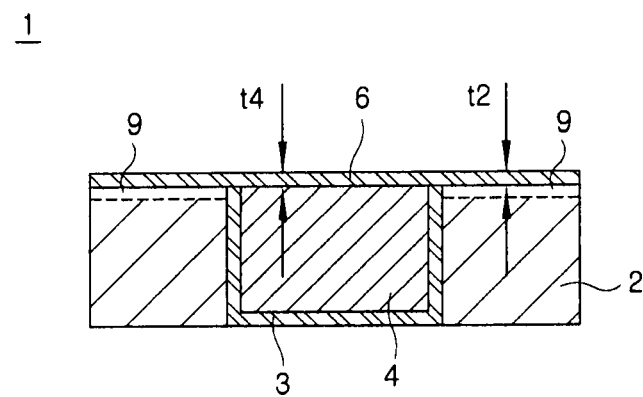

Next, in the substrate 1 shown in FIG. 11B, a manganese-containing film is formed on the copper wiring line 4 and the hydrophilic surface of the interlayer insulating film 2 by using a CVD method using a manganese compound as a film forming gas, as described in step 4 of FIG. 10. In this embodiment, a thermal CVD method using as a film forming gas a manganese compound, e.g., bisethylcyclopentadienylmanganese ($(EtCp)_2Mn[=Mn(C_2H_5C_5H_4)_2]$), is used (FIG. 11C). As a result of this process, in this embodiment, the manganese-containing film 6 is formed on both of the copper wiring line 4 and the interlayer insulating film 2. The manganese-containing film 6 is, e.g., a film containing a manganese oxide. The manganese oxide is formed by reaction with moisture in the base. In this embodiment, since the surface of the interlayer insulating film 2 has the hydrophilic property, the manganese-containing film 6 can also be formed on the interlayer insulating film 2 (FIG. 11D). An example of the specific processing conditions is as follows.

Pressure in processing chamber: between about 1 Pa and about 1000 Pa

Substrate temperature: about 50° C. to about 400° C.

Atmosphere in processing chamber: $(EtCp)_2Mn$ atmosphere

Processing time: about 1 sec to about 600 sec In order to more effectively form the manganese-containing film 6 on the interlayer insulating film 2, moisture may be adsorbed on the hydrophilic surface of the interlayer insulating film 2.

In the second embodiment, the surface of the interlayer insulating film 2 has the hydrophilic property, so that the manganese-containing film 6 can be formed on both of the copper wiring line 4 and the interlayer insulating film 2. The manganese-containing film 6 can be formed such that a film thickness t4 on the wiring line 4 becomes substantially identical to a film thickness t2 on the interlayer insulating film 2. To do so, the amount of moisture in the surface of the interlayer insulating film 2 may be controlled.

The manganese-containing film 6, especially the film containing a manganese oxide, has a function of suppressing diffusion of copper, as described in the first embodiment. Therefore, the manganese-containing film 6 formed by the example of the second embodiment can serve as a barrier film for suppressing diffusion of copper.

(Configuration of Apparatus)
(Film Forming System)

Figure 12:
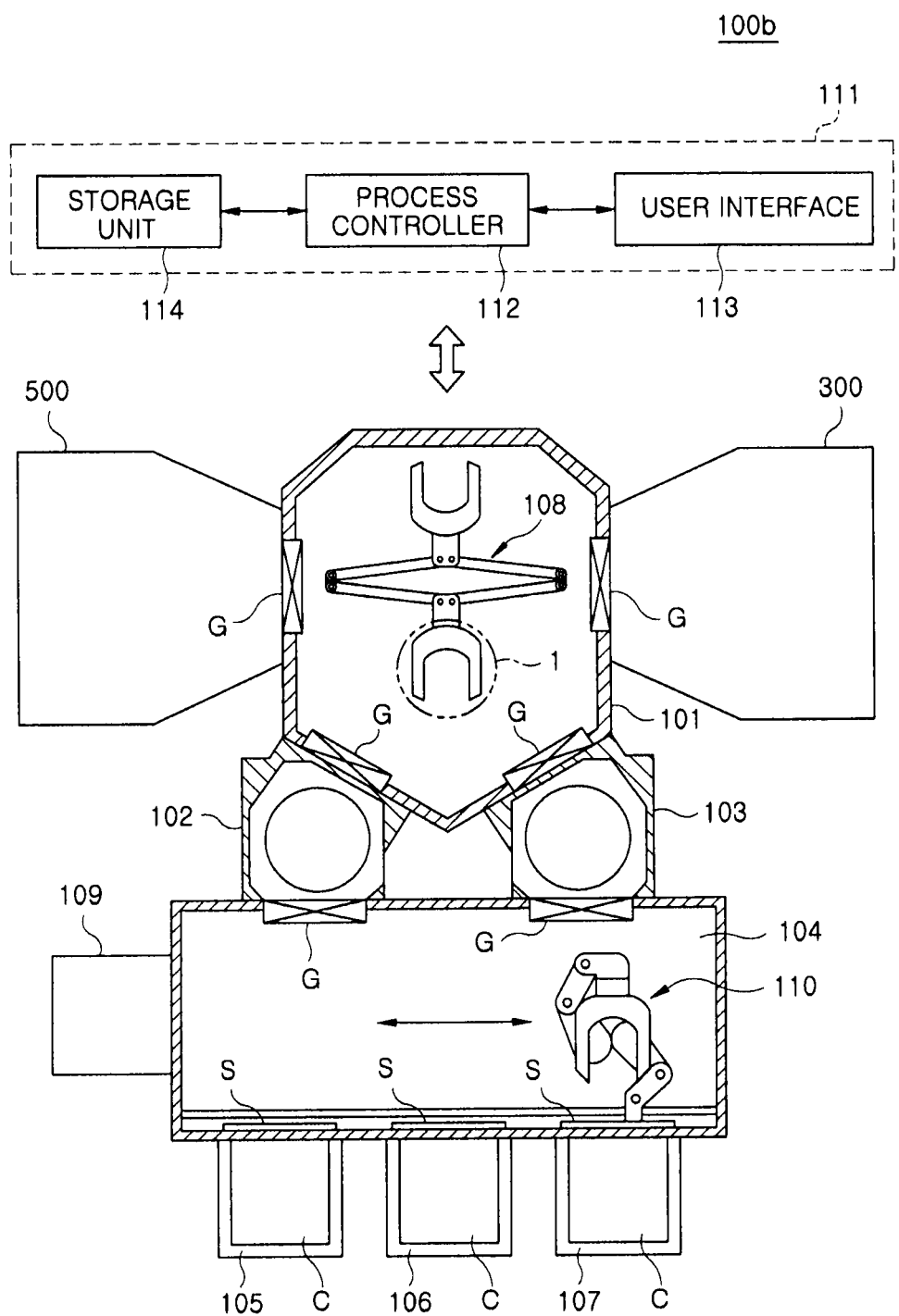
FIG. 12 is a top view schematically showing an example of a film forming system capable of performing the example of the film forming method.

FIG. 12 is a top view schematically showing an example of a film forming system capable of performing an example of the film forming method in accordance with the second embodiment of the present invention.

As shown in FIG. 12, a film forming system 100b is different from the film forming system 100 in that a fourth processing unit 500 is provided instead of the first processing unit 200. The fourth processing unit 500 is connected to the transfer chamber 101 via a gate valve G.

(Processing Unit 500)

The fourth processing unit 500 performs a hydrophilic process on the surface of the interlayer insulating film 2.

Figure 13:
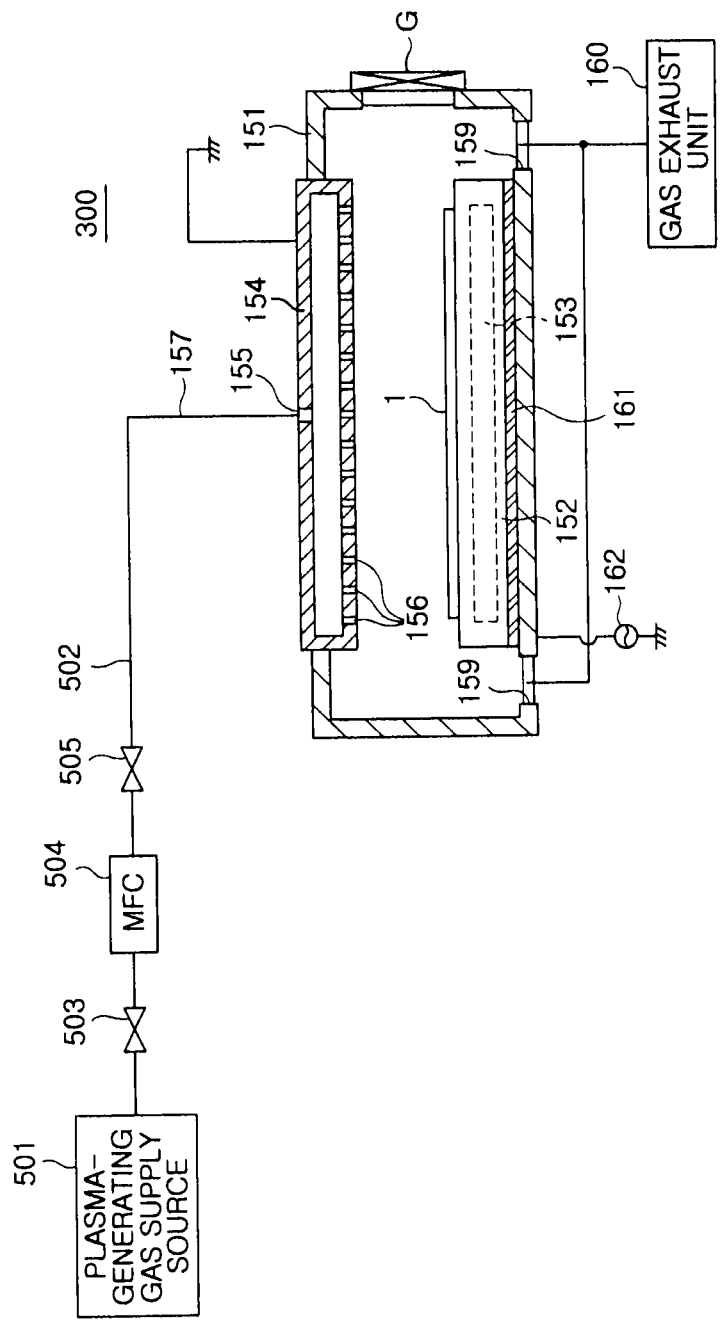
FIG. 13 is a cross sectional view schematically showing an example of a processing unit.

FIG. 13 is a cross sectional view schematically showing an example of the processing unit 500.

As shown in FIG. 13, the processing unit 500 is configured as a parallel plate plasma processing apparatus. The processing unit 500 is different from the processing units 200, 300 and 400 in that the susceptor 152 is insulated from the processing chamber 151 by an insulator 161; a high frequency power supply 162 for supplying a high frequency power is connected to the susceptor 152; the shower head 154 is grounded and serves as an opposite electrode to the susceptor 152; and a line 502 extending from a plasma-generating gas supply source 501 for supplying a plasma-generating gas is connected to the gas supply line 157.

The line 502 is provided with a valve 503, a mass flow controller (MFC) 504 and a valve 505 which are disposed in that order from the plasma-generating gas supply source 501.

The plasma-generating gas is introduced into the processing chamber 151 via the line 502, the valves 503 and 505 for opening and closing the line 502, the mass flow controller 504, the gas supply line 157 and the shower head 154. The plasma-generating gas may be, e.g., a hydrogen-containing gas, a carbon-containing gas, a nitrogen-containing gas, an oxygen-containing gas, a halogen element-containing gas, a rare gas-containing gas, or the like.

In the example of the film forming method in accordance with the second embodiment of the present invention, the film forming system 100b shown in FIGS. 12 and 13 is used to perform the steps of: performing a hydrophilic process on the surface of the interlayer insulating film 2 in the processing unit 500; transferring the substrate 1 subjected to this process to the processing unit 300 via the transfer chamber 101 without being exposed to the atmosphere; and forming the manganese-containing film on the copper wiring line 4 and the interlayer insulating film 2 in the processing unit 300.

In this embodiment, the hydrophilic process for the surface of the interlayer insulating film 2 is carried out by performing a plasma process on the surface of the interlayer insulating film 2 and forming the damage layer 9 thereon. However, it may also be carried out by performing a UV ozone process in which ozone generated by UV radiation is brought into contact with the surface of the interlayer insulating film 2 and forming the damage layer 9 thereon, or by performing a process for allowing moisture to be absorbed on the surface of the interlayer insulating film 2.

(Another Example of Film Forming Method)

Figure 14A:
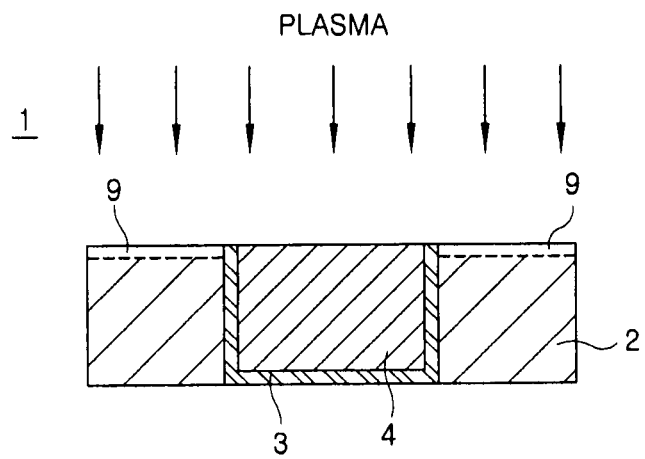
FIGS. 14A to 14C are cross sectional views showing examples of states of a substrate.
Figure 14B:
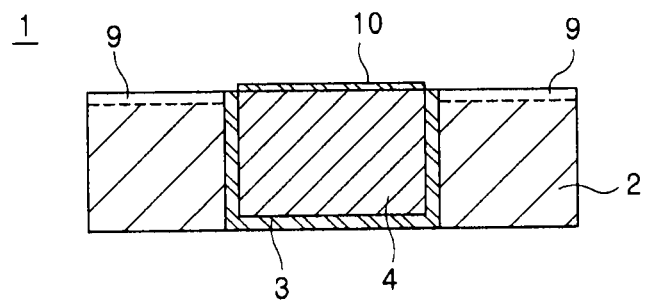
Figure 14C:
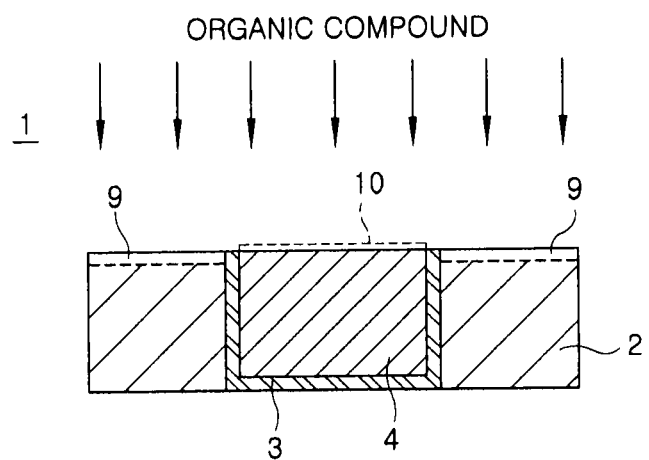

FIGS. 14A to 14C are cross sectional views showing examples of states of the substrate.

When a hydrophilic process is performed on the surface of the interlayer insulating film 2 as shown in FIG. 14A, the oxide 10 may be formed on the surface of the copper wiring line 4 as shown in FIG. 14B. In that case, the oxide needs to be removed from the surface of the copper wiring line 4 while maintaining the hydrophilic property of the surface of the interlayer insulating film 2.

In this embodiment, the oxide 10 formed on the surface of the copper wiring line 4 is removed by using an organic compound while maintaining the hydrophilic property of the surface of the interlayer insulating film 2 (FIG. 14C). Specifically, as for the organic compound, an organic acid containing carboxylic acid, e.g., formic acid (HCOOH), is used. An example of the specific processing conditions is as follows.

Pressure in processing chamber: about 1 Pa to about 101.3 kPa (atmospheric pressure)
Substrate temperature: about 100° C. to about 300° C.
Atmosphere in processing chamber: HCOOH atmosphere
Processing time: about 1 sec to about 600 sec The oxide 10 formed on the surface of the copper wiring line 4 can be removed by using an organic compound. By using the organic compound, it is possible to remove the oxide 10 to be removed from the surface of the copper wiring line 4 while maintaining the hydrophilic property of the surface of the interlayer insulating film 2. After the oxide 10 is removed from the surface of the copper wiring line 4, the manganese-containing film 6 may be formed on the copper wiring line 4 and on the interlayer insulating film 2 as described above.

The organic compound that can be used in another example of the film forming method is the same as that described in the first embodiment.

As for the processing unit, the processing unit 400 shown in FIG. 9 can be used. In other words, the film forming system may have a configuration in which the processing unit 400 is connected to the film forming system 100b shown in FIG. 12.

Another example of the film forming method in accordance with the second embodiment of the present invention can be performed by executing the steps of: performing the hydrophilic process on the surface of the interlayer insulating film 2 in the processing unit 500; transferring the substrate 1 subjected to this process to the processing unit 400 via the transfer chamber 101 without being exposed to the atmosphere; removing the oxide 10 from the surface of the copper wiring line 4 while maintaining the hydrophilic property of the surface of the interlayer insulating film 2; transferring the substrate 1 subjected to this process to the processing unit 300 via the transfer chamber 101 without being exposed to the atmosphere; and forming the manganese-containing film on the copper wiring line 4 and on the interlayer insulating film 2 in the processing unit 300.

In this embodiment, the oxide 10 is removed by the cleaning method using an organic compound. However, the oxide 10 may also be removed by a hydrogen annealing method and an ultra low oxygen partial pressure method.

In accordance with the film forming method of the embodiment of the present invention, it is possible to provide the film forming method capable of determining whether or not a film serving as a cap film or a barrier film is formed.

While the embodiments of the present invention have been described, the present invention is not limited to the above-described embodiments and can be variously modified without departing from the scope of the present invention.

For example, in the first embodiment, in order to prevent the manganese-containing film from growing on the interlayer insulating film, the process for making the surface of the interlayer insulating film non-hydrophilic, e.g., the hydrophobic process or the dehydration process, is performed on the surface of the insulating layer. However, the interlayer insulating film may be made of a non-hydrophilic material. In that case, the non-hydrophilic process can be omitted, so that a throughput can be improved.

When the interlayer insulating film is made of a non-hydrophilic material, the non-hydrophilic process, e.g., the hydrophobic process or the dehydration process, may be performed on the surface of the non-hydrophilic interlayer insulating film. In that case, the growth of the manganese-containing film on the interlayer insulating film can be further suppressed.

In the second embodiment, in order to allow the manganese-containing film to grow on the interlayer insulating film, the process for allowing the surface of the interlayer insulating film to have the hydrophilic property, e.g., the plasma process, the UV ray ozone process, or the moisture adsorption process, is performed on the surface of the interlayer insulating film. However, the interlayer insulating film may be made of a hydrophilic material. In that case, the hydrophilic process can be omitted, thereby improving a throughput.

When the interlayer insulating film is made of the hydrophilic material, the hydrophilic process, e.g., the plasma process, the UV ozone process, or the moisture adsorption process, may be performed on the surface of the hydrophilic interlayer insulating film. In that case, the growth of the manganese-containing film on the interlayer insulating film can be further facilitated.

In the above, the case in which the hydrophobic process or the cleaning method using an organic compound is performed in a gaseous phase (dry process) is described. However, it may also be performed in a liquid state (wet process).

The barrier film 3 is generally made of tantalum (Ta), titanium (Ti) or a nitride thereof. However, a manganese-containing film same as the manganese-containing film 6 of the present invention may be used as the barrier film 3.

The present invention can be variously modified without departing from the scope of the invention.

In accordance with the present invention, it is possible to provide a film forming method capable of determining whether or not a film serving as a cap film or a barrier film is formed.

What is claimed is:

1. A film-forming method for forming a barrier film on a substrate having an insulating film provided with a groove and a copper wiring line formed in the groove, the film-forming method comprising:
    making a surface of the insulating film hydrophobic by hydrophobizing the surface of the insulating film by using a hydrophobic material which allows the surface of the insulating film to have a hydrophobic property;
    removing the hydrophobic material from a surface of the copper wiring line while maintaining the hydrophobic property of the surface of the insulating film; and
    forming a manganese-containing film as the barrier film on the surface of the copper wiring line by a chemical vapor deposition method using a manganese compound,
    wherein said removing the hydrophobic material is performed by using an organic compound,
    wherein forming the manganese-containing film comprises selectively forming the manganese-containing film such that the manganese-containing film is formed directly on the surface of the copper wiring line without being formed directly or indirectly on the surface of the insulating film, and
    wherein, in said forming the manganese-containing film, the manganese-containing film is selectively formed directly on the surface of the copper wiring line from which the hydrophobic material is removed.

2. The film-forming method of claim 1, wherein the manganese compound is at least one compound selected from the group consisting of:
    $(EtCp)_2Mn[=Mn(C_2H_5C_5H_4)_2]$;
    $Cp_2Mn[=Mn(C_5H_5)_2]$;
    $(MeCp)_2Mn[=Mn(CH_3C_5H_4)_2]$;
    $(i-PrCp)_2Mn[=Mn(C_3H_7C_5H_4)_2]$;
    $MeCpMn(CO)_3[=(CH_3C_5H_4)Mn(CO)_3]$;
    $(t-BuCp)_2Mn[=Mn(C_4H_9C_5H_4)_2]$;
    $Mn(DMPD)(EtCp)[=Mn(C_7H_{11}C_2H_5C_5H_4)]$, and
    $((CH_3)_5Cp)_2Mn[=Mn((CH_3)_5C_5H_4)_2]$.

3. The film-forming method of claim 1, wherein the hydrophobic material is at least one material selected from the group consisting of:
    HMDS(Hexamethyldisilazane);
    TMDS(1,1,3,3-Tetramethyldisilazane);
    TMSDMA(Dimethylaminotrimethylsilane);
    DMSDMA(Dimethylsilyldimethylamine);
    TMMAS(Trimethylmethylaminosilane);
    TMICS(Trimethyl(isocyanato)silane);
    TMSA(Trimethylsilylacetylene);
    TMSC(Trimethylsilylcyanide);
    1,3,5,7-tetramethylcyclotetrasiloxane;
    Dimethylsilane;
    Tetraethylcyclotetrasiloxane;
    1,2,3-triethyl-2,4,6-trimethylcyclotrisilazane;
    1,2,3,4,5,6-hexamethylcyclotrisilazane;
    Monomethylsilane;
    Hexamethyldisilane;
    Hexamethylsiloxane;
    Trimethylsilane;
    Tetramethysilane;
    Dimethyldimethoxysilane;
    Octamethylcyclotetrasiloxane;
    Trimethoxymethylsilane;
    Hexaethyldisilazane;
    hexaphenyldisilazane;
    heptamethyldisilazane;
    dipropyl-tetramethyldisilazane;
    di-n-butyl-tetramethyldisilazane;
    di-n-octyl-tetramethyldisilazane;
    divinyl-tetramethyldisilazane;
    1,1,3,3,5,5-hexamethylcyclotrisilazane;
    Hexaethylcyclotrisilazane;
    Hexaphenylcyclotrisilazane;
    Octamethylcyclotetrasilazane;
    Octaethylcyclotetrasilazane;
    tetraethyl-tetramethylcyclotetrasilazane;
    tetraphenyldimethyldisilazane;
    diphenyl-tetramethyldisilazane;
    trivinyl-trimethylcyclotrisilazane; and
    tetravinyl-tetramethylcyclotetrasilazane.

4. The film-forming method of claim 1, wherein the organic compound is at least one compound selected from the group consisting of:
    alcohol;
    aldehyde;
    carboxylic acid;
    anhydrous carboxylic acid;
    ester; and
    ketone.

5. The film-forming method of claim 1, wherein said making the surface of the insulating film hydrophobic, said removing the hydrophobic material, and said forming the manganese-containing film are consecutively performed in separate processing chambers without exposing the substrate to an atmospheric atmosphere.

6. The film-forming method of claim 1, wherein said making the surface of the insulating film hydrophobic is performed in a processing chamber maintained in a vacuum state.

7. The film-forming method of claim 1, wherein the insulating film includes an —OH group on the surface thereof, and said making the surface of the insulating film hydrophobic includes substituting the —OH group with an —O—Si(CH$_3$)$_3$ group.

8. The film-forming method of claim 1, wherein said removing the hydrophobic material is performed on hydrophobic material adhered to the surface of the copper wiring line by said using the organic compound.

9. The film-forming method of claim 1, wherein the hydrophobic material is removed from the surface of the copper wiring line only.

10. The film-forming method of claim 1, wherein said removing the hydrophobic material comprises removing the hydrophobic material together with an oxide adhered to the surface of the copper wiring line.

11. The film-forming method of claim 1, wherein said removing the hydrophobic material is performed in a processing chamber maintained in a vacuum state.

12. The film-forming method of claim 1, wherein said removing the hydrophobic material includes supplying a gas containing the organic compound to the substrate.

13. The film-forming method of claim 1, wherein, in said forming the manganese-containing film, the hydrophobic property of the surface of the insulating film prevents the manganese-containing film from being formed on the surface of the insulating film.

14. The film-forming method of claim 1, wherein, in said forming the manganese-containing film, the manganese-containing film is only formed on the surface of the copper wiring line.

15. The film-forming method of claim 9, wherein, in said forming the manganese-containing film, the manganese-containing film is only formed on the surface of the copper wiring line.

16. The film-forming method of claim 1, wherein the surface of the copper wiring line and the surface of the insulating film are substantially coplanar.

17. The film-forming method of claim 16, wherein the manganese-containing film is a cap film that rises above the surface of the insulating film.

* * * * *